(12) United States Patent
Riddle et al.

(10) Patent No.: US 6,650,187 B1
(45) Date of Patent: Nov. 18, 2003

(54) DECISION DIRECTED SUPPRESSED CARRIER SYMBOL-RATE PLL WITH PROGRAMMABLE PHASE DISCRIMINATOR AND CHIP-RATE PHASE EXTRAPOLATION

(75) Inventors: Christopher Riddle, San Diego, CA (US); Serguei A. Glazko, San Diego, CA (US)

(73) Assignee: Qualcomm, Incorporated, San Diego, CA (US)

( * ) Notice: Subject to any disclaimer, the term of this patent is extended or adjusted under 35 U.S.C. 154(b) by 0 days.

(21) Appl. No.: 10/233,246

(22) Filed: Aug. 29, 2002

(51) Int. Cl.[7] .................................................. H03L 7/00

(52) U.S. Cl. ......................................................... 331/17

(58) Field of Search ................................ 327/147, 148, 327/149, 150, 156, 157, 158, 159; 331/17

(56) References Cited

U.S. PATENT DOCUMENTS 5,872,810 A * 2/1999 Philips et al. ................ 375/222

* cited by examiner

Primary Examiner—Jeffrey Zweizig
(74) Attorney, Agent, or Firm—Philip R. Wadsworth; Charles D. Brown; Howard H. Seo

(57) ABSTRACT

A phase lock loop apparatus and method is disclosed. A typical apparatus includes a demodulator receiving a phase error signal from a comparator at a chip rate and providing a phase error update over a symbol period from the phase error signal wherein the chip rate is higher than the symbol rate. A phase discriminator produces a phase error output at the symbol rate from the phase error update based upon a signal modulation type. A loop filter produces one or more phase estimate parameters at a symbol rate from the phase error output and a numerically controlled oscillator (NCO) extrapolates a phase reference at a chip rate from the one or more phase estimate parameters at a symbol rate. The comparator produces the phase error signal to the demodulator based upon the phase reference and an incoming signal.

47 Claims, 3 Drawing Sheets

DECISION DIRECTED SUPPRESSED CARRIER SYMBOL-RATE PLL WITH PROGRAMMABLE PHASE DISCRIMINATOR AND CHIP-RATE PHASE EXTRAPOLATION

BACKGROUND OF THE INVENTION

1. Field of the Invention

The present invention relates to systems and methods for implementing phase lock loop (PLL) circuits, and particularly for implementing PLL circuits to facilitate a wireless local area network (LAN). For example, the present invention finds application in the Institute of Electrical and Electronics Engineers (IEEE) 802.11 standard for wireless LANs.

2. Description of the Related Art

Wireless LAN (WLAN) standards (802.11b and 802.11g, for example) specify a transmit center frequency tolerance and chip clock frequency tolerances to be +/−25 ppm maximum. The two-way error between the receiver and transmitter can be up to +/−50 ppm and must be tracked by the receiver synchronization blocks. To establish a coherent reference at the receiver, the acquisition of frequency and timing is performed first. The maintenance of the coherent reference is achieved by tracking. Often the same synchronization mechanism is used to perform both acquisition and tracking. Among the most common architectures are the phase lock loop (PLL) for phase and frequency acquisition and tracking, and time-tracking loop (TTL) for chip timing acquisition and tracking. If the data is modulated directly on the carrier signal, or through a square-wave subcarrier, a suppressed carrier signal will result, and typically a special class of suppressed carrier tracking loops is then used.

There are different types of loops to perform chip level phase tracking. However, the performance of current PLLs, particularly those that operate with suppressed carrier signals, should take full advantage of the processing potential of the system. Current PLLs suffer squaring loss, lower symbol-to-noise ratios (SNR), and require more hardware resources than necessary to implement.

Accordingly, there is a need for PLLs with improved SNR and lower hardware requirements. Further, there is particularly a need for such PLLs in WLAN applications. The present invention meets these needs.

SUMMARY OF THE INVENTION

Embodiments of the invention include a PLL for suppressed carrier signals, such as with IEEE 802.11 standard signals, that takes advantage of symbol processing gain and extrapolates phase to chip-rate for effective phase error correction at the chip level. Embodiments of the invention perform well at high-frequency error and achieve fast phase and frequency acquisition. Further embodiments of the invention utilize an efficient and programmable phase discriminator.

The extrapolation is a novel approach that improves performance significantly. In addition, the loop utilizes a programmable mode decision directed phase discriminator that avoids squaring loss and takes advantage of known modulation types, for example BPSK or QPSK. Known loops, such as Costas and power loop work well with a suppressed carrier signal but exhibit the squaring loss and require more hardware (HW) than necessary.

Embodiments of the invention provide an efficient PLL implementation that allows fast frequency and phase synchronization and tracking, particularly in IEEE 802.11 or similar systems. The invention takes advantage of symbol rate processing, which affords an increased SNR and less hardware, and applies a chip-rate phase extrapolation technique to correct the phase between the symbol updates. The invention uses an efficient mode programmable decision directed phase discriminator for optimal noise performance and implementation.

A typical embodiment includes a demodulator receiving a phase error signal from a comparator at a chip rate and providing a phase error update over a symbol period of a symbol rate from the phase error signal wherein the chip rate is higher than the symbol rate. A phase discriminator produces a phase error output at the symbol rate from the phase error update based upon a signal modulation type. A loop filter produces one or more phase estimate parameters at a symbol rate from the phase error output and a numerically controlled oscillator (NCO) extrapolates a phase reference at a chip rate from the one or more phase estimate parameters at a symbol rate. The comparator produces the phase error signal to the demodulator based upon the phase reference and an incoming signal The extrapolation process can be performed linearly or non-linearly based upon the phase estimate parameters produces by the loop filter. In an exemplary linear extrapolation, the loop filter can be implemented as a proportional and integral filter providing a phase change value and a phase rate value (e.g., a frequency error value) as the phase estimate parameters. A multiplexer can be used to load the phase estimate parameters into the NCO for extrapolation of the chip rate phase reference. Further, the NCO can include a look-up table for determining the phase reference as a sine and cosine function. The phase discriminator can include a slicing operation and is programmable to produce the phase error update based upon the modulation type. Typically, the modulation type is a biphase shift key (BPSK) modulation or a quadrature shift key (QPSK) modulation.

Further embodiments of the invention include a frequency estimator for estimating a frequency error and setting a loop filter accumulator state to the frequency error. The frequency estimator computes a decision directed cross-product discriminator to estimate the frequency error and applies it to the loop filter.

In still further embodiments, the loop filter can also include loop programmable bandwidth settings for a plurality of loop bandwidths. The loop bandwidth settings can alternately be programmed to an acquisition and a tracking loop bandwidth to improve the overall performance of the PLL.

BRIEF DESCRIPTION OF THE DRAWINGS

Referring now to the drawings in which like reference numbers represent corresponding parts throughout.

DETAILED DESCRIPTION

In the following description of the embodiments, reference is made to the accompanying drawings which form a part hereof, and in which is shown by way of illustration specific embodiments in which the invention may be practiced. It is to be understood that other embodiments may be utilized and structural changes may be made without departing from the scope of the present invention.

Overview

The present invention describes an apparatus and method of implementing a decision directed suppressed carrier symbol-rate PLL with a programmable phase discriminator and a chip rate phase extrapolation, particularly applicable to WLAN applications.

Exemplary IEEE 802.11 Signal Model for Carrier Tracking

Taking the IEEE 802.11b standard as an example, the signal modulation can be of two different types: differential phase shift keying (DPSK) (either bi-phase or quadrature-phase [BPSK or QPSK]) modulation for 1 and 2 Mbs data rates, and complementary code keying (CCK) modulation for 5.5 and 11 Mbs data rates. In the case of 1 and 2 Mbs data rates, the signal is spread by a square-wave subcarrier signal in the form of a Barker sequence (a class of pseudo-random (PN) sequences with specific correlation properties). In the case of the 5.5 and 11 Mbs data rates, the CCK modulation is superimposed on top of the DPSK modulation and can be thought of as a square-wave subcarrier waveform as well. Thus, the signal can be written as follows:

$$S(n)=d(nT_s) \cdot Sq(n) \cdot exp[j2\pi(F_o+F_o^e)n+\Phi_o]+N(n), \quad (1)$$

where $F_o^e$ is a residual frequency error observed in the received baseband discrete signal. Note that the rate of the square-wave signal and the data modulation signal are different, and some additional processing to remove the square-wave subcarrier is usually performed.

Figure 1:
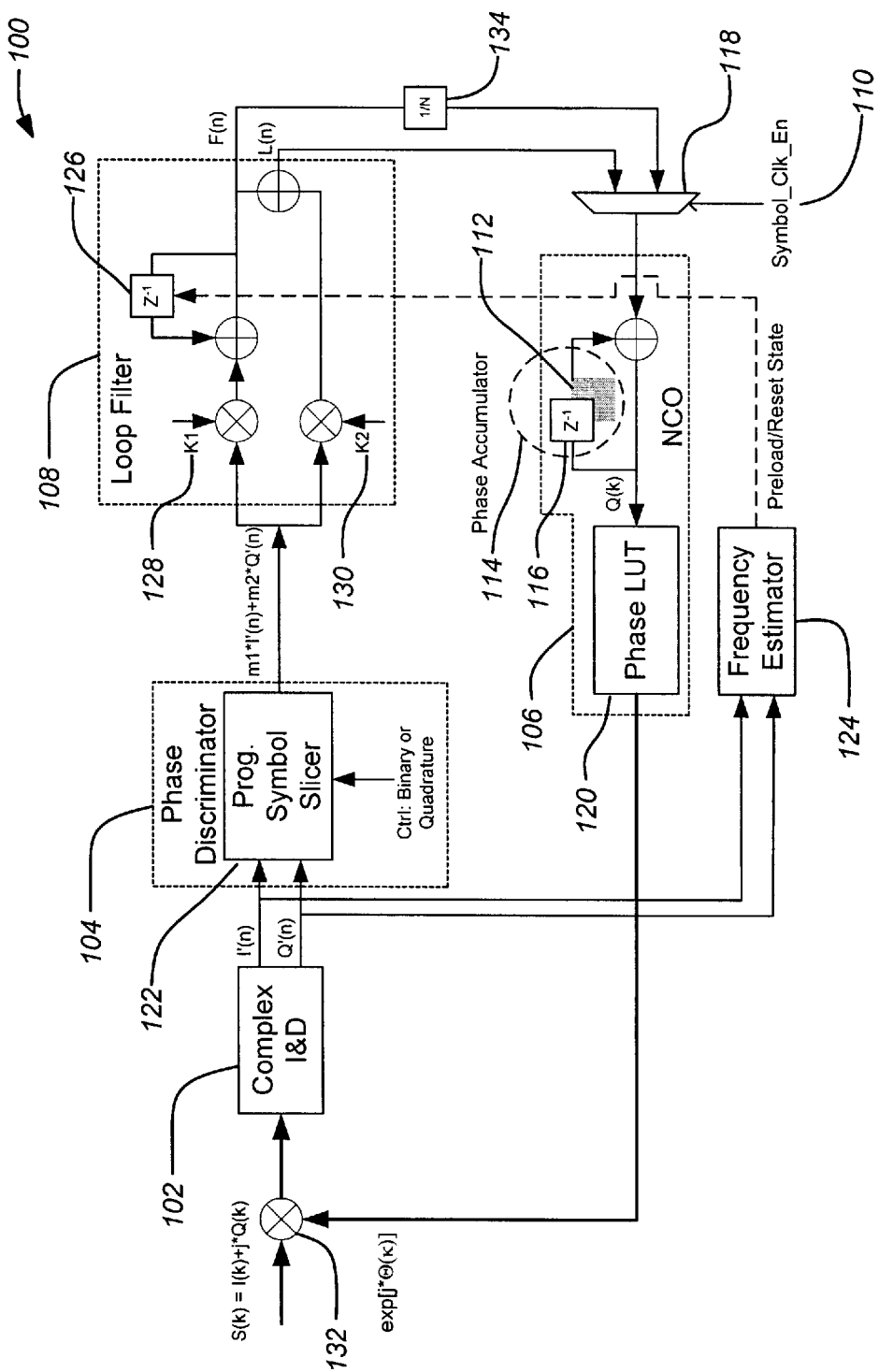
FIG. 1 illustrates a block diagram of a PLL circuit embodiment of the present invention.

Second Order PLL with Square-Wave Subcarrier Removal and Phase Error Extrapolation FIG. 1 is a block diagram of an exemplary PLL 100 embodiment of the invention. The PLL 100 embodiment efficiently combines the demodulation and symbol level phase tracking with chip level linear phase extrapolation. The optimal demodulation process in an IEEE 802.11b standard system (or any other system with orthogonal spreading) includes the square-wave subcarrier removal (to achieve processing gain in the case of a Barker sequence spreading or coding gain in the case of CCK). This mechanism can be implemented as a correlator, or a bank of correlators, tuned to a certain offset of a Barker PN sequence or a particular code word (in the case of CCK bi-orthogonal modulation).

The implementation of the correlator could be an integrate and dump (I&D) 102 mechanism, receiving a phase error signal from a comparator 132, as shown (where chips are multiplied by the local replica of the square-wave and summed together over one symbol period) or some other suitable mechanism, such as low-pass filter. This achieves two goals—removing the subcarrier and producing a soft symbol value for further processing. Note that the symbol-to-noise ratio (SNR) is improved by the amount of processing gain (usually it is a spreading factor, i.e. the number of square-wave subcarrier chips per symbol, Nc). For example, a processing gain of 11 results in an SNR gain of approximately +10.4 dB. The PLL phase error updates can be computed at the symbol level (a slower rate) by the discriminator 104 and applied to the numerically controlled oscillator 106 (NCO) for the coherent carrier reference generation at the chip rate, or even a sub-chip rate.

Figure 2A:
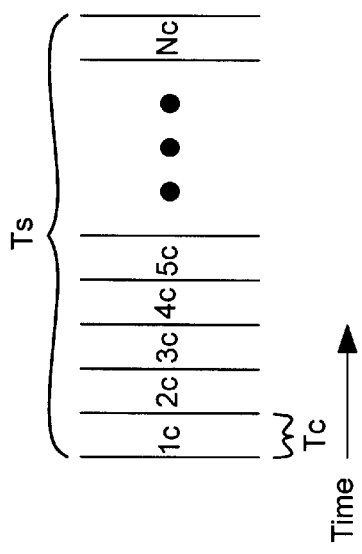
FIG. 2A illustrates the chip and symbol rate relationship.

FIG. 2A illustrates the relationship between the chip rate and the symbol rate. A symbol interval or period, Ts, includes a number, Nc, of chips each having an interval, Tc. In general, processing within each section of the PLL 100 operates at either the chip rate, 1/Tc, or the symbol rate, 1/Ts, as discussed hereafter.

To provide a chip rate phase reference from a symbol rate phase estimate, a linear phase error extrapolation is performed. This technique assumes that the worst type of error is a first order ramp. This is sufficient for most practical low to moderate speed wireless applications and specifically for 802.11 WLAN systems where low-speed mobility and relatively short packet duration are expected. Other (non-linear) phase extrapolation techniques can also be used, however, applying the same principle outlined herein.

The closed loop PLL transfer function can be obtained by examining the FIG. 1 diagram:

$$H(s) = \frac{\Theta i(s)}{\Theta o(s)} = \frac{F(s)}{s+F(s)} = \frac{k_1 s + k_2}{s^2 + k_1 s + k_2} \quad (2)$$

A well-known second-order transfer function for a high-gain loop takes a form:

$$H(s) = \frac{2\xi\omega_n s + \omega_n^2}{s^2 + 2\xi\omega_n s + \omega_n^2} \quad (3)$$

Figure 2C:
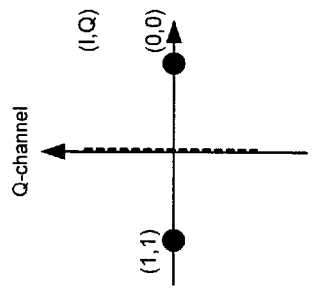
FIG. 2C illustrates the BPSK decision regions.
Figure 2B:
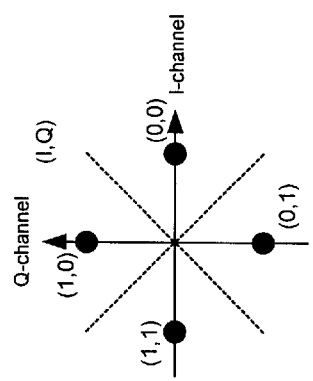
FIG. 2B illustrates the QPSK decision regions.

Note the loop is high-gain if KdKo>>$\omega_n$, where Kd is the PD gain (applied as K1 shown in FIG. 1), and Ko is the NCO gain (applied as K2 shown in FIG. 2). The loop bandwidth is defined:

$$B_l = \frac{\omega_n}{2}\left(\xi + \frac{1}{4\xi}\right) \quad (4)$$

Square-Wave Subcarrier Removal

In the exemplary embodiment, the square wave subcarrier is removed by performing an Integrate and Dump (I&D) 102 operation. This operation can be shared with the standard IEEE 802.11b demodulator or one dedicated entirely for the PLL 100. In this scope it can be considered as part of the PLL without loss of generality. The I&D 102 block is termed "Complex I&D" and can be a soft symbol estimate produced by either a Barker matched filter (BMF) block or alternatively, by a CCK correlator bank or any other despreading mechanism that removes orthogonal subcarrier and accumulates coherent energy over one symbol period. The importance of the I&D 102 inclusion into PLL data path is emphasized by the fact that the PLL phase discriminator 104 as well as loop filter 108 operate at the symbol rate and benefit from the processing gain associated with I&D 102 mechanism. The processing gain of the I&D 102 can be defined as Nc—the length of coherent integration in chips (typically, the number of chips of the square-wave subcarrier per symbol). All the PLL processing from the I&D 102 up to the NCO 106 is performed at the symbol rate.

Chip-Rate Phase Extrapolation

The rate of phase error updates into the PLL 100 is the same as symbol rate. This means that the average symbol phase is estimated by the loop, and therefore cannot be directly used for the signal rotation at chip or sub-chip sample rate. However, it is beneficial to correct the phase changes at the sample level, since ±50 ppm of frequency error translates into approximately 22 degrees of phase error over one symbol and will result in significant loss if not corrected. The loss can be more significant for CCK modulations, since the equalizer and demodulator rely on clean phase reference to maximize the performance.

The phase correction at the chip rate can still be performed by a phase extrapolation in the NCO 106 block. This can be achieved by running the NCO 106 at the sample rate or the chip rate, while the loop filter 108 output is updated only on symbol boundaries, or every Nc chips.

As depicted in FIG. 1, the new input to the loop filter 108 from the phase discriminator 104 is available every symbol time interval, Ts, in seconds. The loop filter 108 operation is performed and new values are accumulated in loop filter 108 accumulator as well as F(n) and L(n). Note the L(n) is the loop filter 108 output and is proportional to the phase change over one symbol between the received signal and local NCO 106 phase reference. The F(n) value, on the other hand, is proportional to the derivative of the phase, or the frequency error between the received signal and local NCO 106 frequency. Note also that the frequency represents the rate of change for the phase, and therefore can be used in a linear phase extrapolation method.

On every Ts interval (or symbol boundary) the new values of F(n) and L(n) are generated by the loop filter 108. The L(n) value is selected by the multiplexer 118 block controlled by the "symbol_clock_enable" timing signal 110. The L(n) value is added to the shadow register 112 of phase accumulator 114 state (shown as shadowed block on the FIG. 1) and loaded into the actual accumulator state register 116. The shadow register 112 is only active on symbol boundaries or when the new update is available from the phase discriminator 104.

Between the symbol phase updates, the NCO 106 outputs an extrapolated phase reference in the following manner. Every Tc interval (Tc=Ts/Nc chip duration in seconds), the phase accumulator 114 inside the NCO 106 is updated with the F(n)/Nc value, produced by the divider 134 block from the F(n) output of the loop filter 108 and selected by the multiplexer 118 block. The Q(k) value is an extrapolated version of the phase reference for every chip between the symbol updates. This continues until the next symbol boundary when the new values of L(n) and F(n) are available and multiplexer switches to select the L(N) update to add it to the shadow register 112. It loads the copy of shadow register 112 into the phase accumulator 114 state register 116 and continues the new chip rate phase extrapolation with the new value of F(n).

Phase Generation Using Look-Up Table (LUT)

Note that the signal from NCO accumulator is an integer value in digital implementation and needs to be mapped into actual Sine and Cosine functions. This is conveniently accomplished by storing the values of Sine and Cosine in a look-up table 120 (LUT) and extracting them from the LUT 120 based on the integer value of Q(k).

Programmable Decision-Directed Phase Discriminator

The decision directed phase discriminator 104 (PD) is an important element of PLL embodiments of the present invention, as an IEEE 802.11b frame may have adjacent segments with different types of modulation. In general, the signal constellation at the chip or symbol level will be either BPSK or QPSK depending on the rate and the frame segment.

Three main frame segments are of importance for this discussion: the preamble, the header and the data unit. Typically, the 802.11b frame will have a preamble that is always transmitted using a BPSK constellation. The header portion, that can be either BPSK or QPSK, follows the preamble. The type of the header is uniquely determined by the last 16 bits of the preamble, and therefore a control signal can be generated to reprogram the phase discriminator. Likewise, the constellation over the data portion of the frame that follows the header is known from the header fields, and can be used to reprogram the PD 104 yet again.

It is important to take advantage of BPSK constellation in the decision directed PD 104 to minimize the propagation of the decision error, and thus make the PLL 100 more noise resistant. Another advantage of having a programmable PD 104 is that it allows controlling the dimension along which the BPSK signal is aligned (commonly Real or I dimension). This eliminates a 90-degree phase ambiguity in the rotated constellation and makes BPSK demodulation possible with symbol decision regions preset in advance by the PLL designer.

Several more advantages of having decision directed PD 104 include avoiding the squaring loss that results in the case of a Costas type discriminator (I(n)*Q(n)) or power loop discriminator and avoiding the squaring operation all together, which makes a hardware implementation more efficient.

The task of the programmable PD 104 is to output the signal proportional to the phase error depending on the expected constellation. The decision regions for the QPSK and BPSK constellations are shown on FIGS. 2B and 2C, respectively.

The actual application of the decision regions is sometimes called a slicing operation 122, therefore the complex symbol {I(n), Q(n)} is applied to slicer 122 which maps it to one of four points for QPSK or two points for BPSK.

The slicing operation 122 can be expanded to produce the following signal, termed the PD output: m1*I(n)+m2*Q(n). This signal is identified in FIG. 1 as the input to loop filter 108 block, where m1 and m2 values are defined as follows:

For $PD$ mode $== QPSK$

If $I'(n) > 0$ & $I'(n) > |Q'(n)|$, $\quad m1 = 0, m2 = 1$;

If $Q'(n) > 0$ & $Q'(n) > |I'(n)|$, $\quad m1 = -1, m2 = 0$;

If $I'(n) < 0$ & $|I'(n)| > |Q'(n)|$, $\quad m1 = 0, m2 = -1$;

If $Q'(n) < 0$ & $|Q'(n)| > |I'(n)|$, $\quad m1 = 1, m2 = 0$;

For $PD$ mode $== BPSK$

If $I'(n) > 0$, $\quad m1 = 0, m2 = 1$;

If $I'(n) < 0$, $\quad m1 = 0, m2 = -1$;

Loop Filter

The loop filter 108 is shown in FIG. 1, represented as a well-known active proportional+integral (PI) filter, taken from control theory. See e.g., *Phase-Locked Loops—Theory, Design, and Applications,* Roland E. Best, McGraw-Hill, Inc., 1994, which is hereby incorporated by reference herein. The filter transfer function can be written as:

$$F(s) = \frac{K1 + K2s}{s} = \frac{1 + \frac{K2}{K1}s}{\frac{1}{K1}s} = \frac{1 + \tau_2 s}{\tau_1 s} \tag{5}$$

Optional Pull-In Acceleration Using Frequency Estimation Mechanism

The pull-in range of the PLL is defined as the frequency range from the center frequency of NCO 106 within which the loop will always become locked. The pull-in process can be rather slow.

On the other hand, the lock range is defined as the range from center frequency, within which the PLL locks in one single-beat note, between the reference frequency and the output frequency. The lock-in process is much faster than the pull-in process, but the lock-in range is much smaller than the pull-in range of the loop. The values of these ranges can be determined as follows.

The equation that relates the lock-in range to the time constants of the loop is:

$$F(\Delta\omega_L) \approx \frac{\tau_2}{\tau_1} \quad (6)$$

For the high-gain loop (most practical loops are high-gain):

$$\Delta\omega_L \approx 2\xi\omega_n \text{ and } T_L \approx \frac{2\pi}{\omega_n} - \text{Lock-in time or settling time.}$$

The following equation can be used to estimate the pull-in time of the second-order PLL with active PI filter:

$$T_p = \frac{\pi^2}{16} \cdot \frac{\Delta\omega_o^2}{\xi\omega_n^3} \quad (7)$$

The loop pull-in process is one of the most time critical for a contemplated design. Every 802.11b frame has a preamble field designated for acquisition and synchronization tasks. Two preamble modes are supported. The short preamble is approximately 52 $\mu$s long, and all the tasks must be performed within this budget before coherent demodulation of data fields can be initiated. The short preamble budget is challenging to meet, since many tasks may be performed (e.g., signal power detection, AGC, peak detection and symbol timing synchronization, PLL settling, channel impulse response estimation and equalizer training), leaving very limited time for PLL settling.

One way to accelerate the PLL pull-in process is to place its loop filter state value near or within the lock-in range of the loop. This can be achieved by estimating the frequency error and setting the loop filter accumulator state to that estimated value. The frequency estimation in general can take a short time, assuming good SNR after processing gain. (A typical 802.11b receiver is expected to operate at ~10 dB symbol SNR or higher.)

3.6.1 Frequency Estimation Based On Decision Directed Cross-Product Discriminator The frequency estimator 124 as shown in FIG. 1 performs the following operation to compute the decision directed cross-product discriminator and load it into an accumulator 126 of the loop filter 108.

$$\hat{F}_e(n)=[I(n-1)*Q(n)-I(n)*Q(n-1)]\cdot\text{sign}\{I(n-1)*I(n)+Q(n-1)*Q(n)\}$$

The inclusion of decision directed part is necessary due to the fact that the preamble is BPSK symbol modulated, and the pattern is unknown at the receiver. The actual frequency error can be estimated over N symbols (e.g., N=4).

$$\hat{F}_e = \frac{1}{N}\sum_{n=1}^{N}\hat{F}_e(n) \quad (9)$$

Note that the error is proportional to the actual frequency error measured in Hz in the signal:

$$\hat{F}_e(n) \approx Io \cdot (Nc)^2 \cdot (2\pi \cdot Nc \cdot Tc) \cdot \Delta f \quad (10)$$

The loop accumulator value in Hz is proportional to:

$$Facc = \Delta f \cdot 2\pi \cdot Ts = \Delta f \cdot 2\pi \cdot Tc \cdot Nc \quad (11)$$

To load a properly scaled estimated frequency value into the accumulator 126, the following scaling must be performed:

$$Facc \Leftarrow \frac{F_e}{Io \cdot (Nc)^2} \quad (12)$$

As shown hereafter, the pull-in acceleration cuts the settling time drastically, and helps achieve synchronization within the preamble budget time.

Acquisition and Tracking PLL Modes

An alternative approach (and possibly preferred as being more HW efficient) to the fast phase and frequency acquisition involves the use of a programmable loop bandwidth. The initial setting will guarantee the proper transient response and fast acquisition time well within the range of the desired acquisition budget. For a typical 802.11b application, this factor is critical. If the loop can achieve a steady state in approximately 10–15 $\mu$s, the design objective of training the equalizer and demodulating the header with a short preamble can be met. Since the initial pull-in process requires a large loop bandwidth to acquire residual frequency offsets of up to +/−50 ppm, the phase noise at the output of the PLL 100 could be large and affect the quality of the demodulation. To reduce the phase noise and thus improve the demodulation quality, it is recommended to switch the PLL mode into a tracking mode once the lock is achieved. This is done by programming a new set of K1 and K2 (e.g., see FIG. 1) coefficients 128, 130 for the loop filter. The sets of coefficients 128, 130 can be precomputed and stored to accommodate the acquisition and tracking loop bandwidth of interest.

Exemplary 8-bit PLL coefficients 128, 130 are programmable by DSP. It is also possible to program more than just a pair of coefficients 128, 130 to allow a smooth transition from acquisition (wide loop bandwidth) to tracking (narrow loop bandwidth) mode. The following expressions can be used to set the coefficient values 128, 130 of K1 and K2:

$$\alpha = 2 \cdot \xi \cdot \omega_n \cdot \Delta T + \frac{(\omega_n \cdot \Delta T)^2}{2} \quad (13)$$

$$\beta = 2 \cdot (\omega_n \cdot \Delta T)^2 \quad (14)$$

K1 is proportional to $\alpha$ and K2 is proportional to $\beta$. The proportionality constant is needed to account for different bit manipulations in the data path.

Exemplary Method Implementing the PLL

Figure 3:
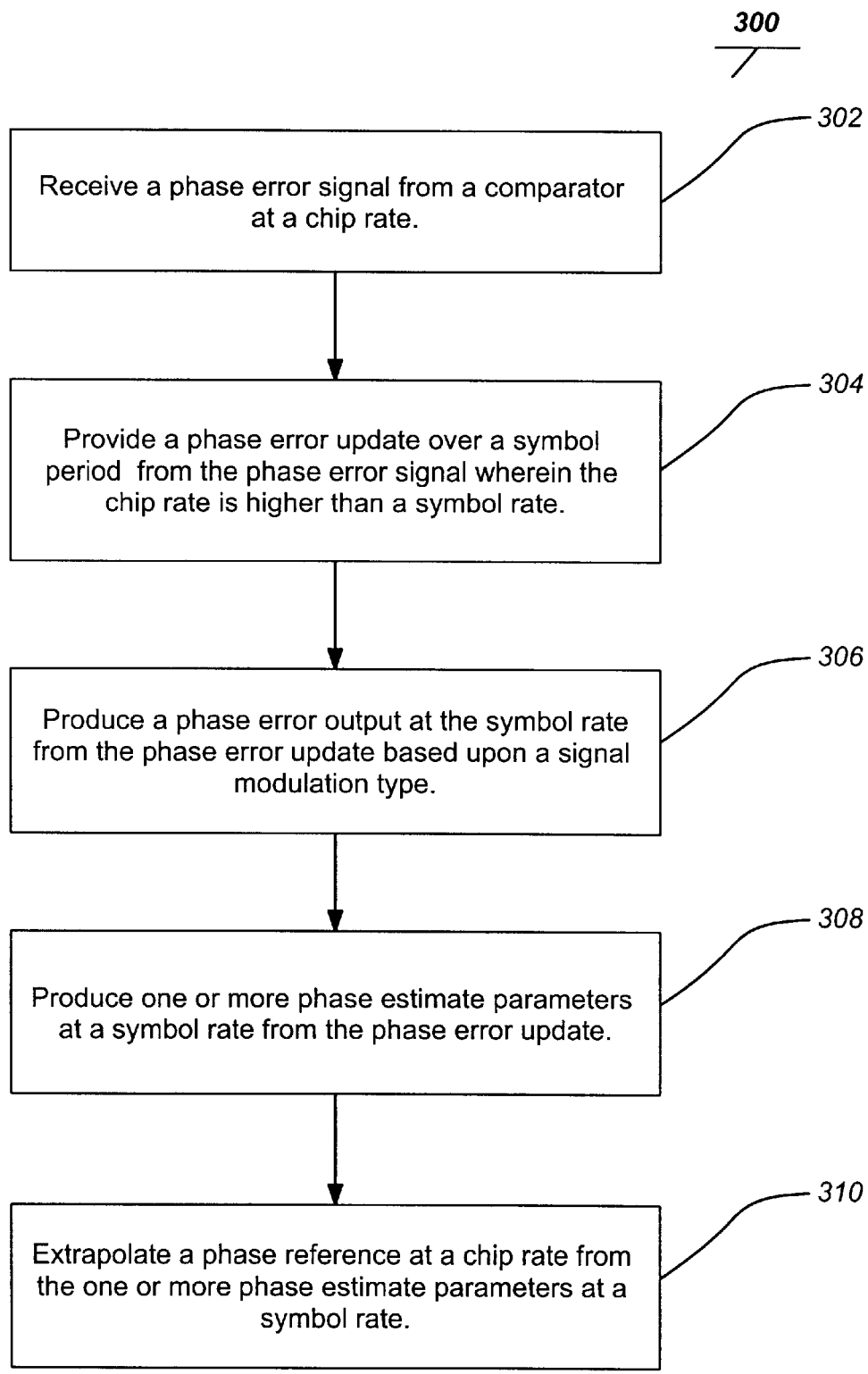
FIG. 3 is a block diagram of an exemplary method implementing a PLL embodiment of the invention.

FIG. 3 is a block diagram of an exemplary method 300 implementing a PLL embodiment of the invention. The method includes receiving a phase error signal from a comparator at a chip rate at block 302. At block 304, a phase error update is provided over a symbol period from the phase error signal wherein the chip rate is higher than the symbol rate. Next, at block 306, an output is produced at the symbol rate from the phase error update based upon a signal modulation type. At block 308, one or more phase estimate parameters are produced at a symbol rate from the phase error update. Finally at block 310, a phase reference is extrapolated at a chip rate from the one or more phase estimate parameters at a symbol rate. The comparator produces the phase error signal based upon the phase reference and an incoming signal.

Noise Performance of the PLL

The noise performance of the loop can be charaterized by the phase noise (or jitter) at the PLL output. The noisy phase reference will degrade the demodulator performance and result in some increase BER of the receiver. To characterize the loop performance and overall effect on the demodulation quality, two parameters are often used: the phase noise standard deviation and the probability of bit error that includes the effect of phase noise. The alternative measure will be the SNR demodulation loss, derived either from the bit error probability increase for noisy phase reference or directly from estimation of SNR of phase corrected symbols. Note that this second approach does not work very well for low SNR regions, due to some bias in the estimation of signal and noise power (in either BPSK or QPSK signals).

The following results were obtained from the loop simulation. The phase standard deviation was found to be less than 0.15 radians for most practical (SNR) ranges (0 dB and up for chip SNR), including the approximately 10 dB symbol SNR or higher of a typical 802.11b receiver. This implies no practical degradation in demodulation Pb due to phase noise. The expected phase noise at the output of the PLL is estimated by the following formula:

$$\bar{\phi}^2 = \frac{1}{2 \cdot (SNR)_L} \text{rad}^2 \quad (15)$$

$$(SNR)_L = (SNR)_I \cdot \frac{B_i}{2B_L} \quad (16)$$

where $B_i$ is the input signal bandwidth, and $B_L$ is the loop bandwidth. Thus, the ratio of these two quantities is the SNR improvement of the loop.

In the case of a 802.11b signal design, the ratio is on the order of 100 in the tracking mode. Therefore, the phase noise can be expected to be very small for all practical input symbol SNR values.

The loss due to phase noise as measured by the BER increase is derived from the assumption of the first order loop phase noise pdf, and can be found, for example, in *Digital Communications—Fundamentals and Applications*, Bernard Sklar, Prentice Hall, 1988, which is hereby incorporated by reference herein.

$$P_B = \int_0^{2\pi} Q\left(\sqrt{\frac{2E_b \cos\beta}{N_o}}\right) \cdot \frac{\exp(p \cdot \cos\beta)}{2\pi I_o(p)} d\beta \quad (17)$$

where p is the loop SNR. Note, that for a 20 dB loop SNR the phase noise std is approximately 0.1 radians, and will result in no degradation in Pb. If the loop SNR were to approach approximately 10 dB, the phase noise std becomes approximately 0.32 radians, resulting in an SNR degradation of approximately 0.8 dB at Pb=$10^{-5}$.

Loop Response to a Frequency Step

The loop response to a frequency step is the critical parameter to consider in the loop performance. In a typical 802.11b system, every packet can arrive at a different center frequency (+/−25 ppm on each side of the link as allowed by the standard). Therefore, the signal at the loop will be seen as a frequency step, if there is a difference between the local oscillator frequency and the center frequency of the received signal. The loop can respond to the frequency step and track a linear phase ramp. This results in some constant steady-state phase error. The value of the error can be estimated as:

$$\lim e(t) = \frac{\Delta \omega}{K_o}. \quad (18)$$

The steady-state error exists regardless of the order of the loop filter, unless the loop filter contains a factor of (jw) in the denominator. The active PI filter satisfies this condition and performs as an ideal integrator. Therefore, no steady-state phase error should be observed at the loop output as a function of input frequency offset. A nearly ideal integrator implementation is possible in the digital domain, but is more difficult in the analog domain with passive components.

CONCLUSION

This concludes the description including the embodiments of the present invention. The foregoing description of the embodiments of the invention has been presented for the purposes of illustration and description. It is not intended to be exhaustive or to limit the invention to the precise form disclosed. Many modifications and variations are possible in light of the above teaching.

It is intended that the scope of the invention be limited not by this detailed description, but rather by the claims appended hereto. The above specification, examples and data provide a complete description of the manufacture and use of the apparatus and method of the invention. Since many embodiments of the invention can be made without departing from the scope of the invention, the invention resides in the claims hereinafter appended.

What is claimed is:

1. A phase lock loop (PLL), comprising:
    a demodulator receiving a phase error signal from a comparator at a chip rate and providing a phase error update over a symbol period from the phase error signal wherein the chip rate is higher than a symbol rate;
    a phase discriminator producing a phase error output at the symbol rate from the phase error update based upon a signal modulation type;
    a loop filter producing one or more phase estimate parameters at a symbol rate from the phase error output; and
    a numerically controlled oscillator (NCO) for extrapolating a phase reference at a chip rate from the one or more phase estimate parameters at a symbol rate;
    wherein the comparator produces the phase error signal to the demodulator based upon the phase reference and an incoming signal.

2. The PLL of claim 1, wherein the demodulator removes a square wave subcarrier from the incoming signal and produces the phase error update.

3. The PLL of claim 1, wherein the NCO extrapolates the phase reference linearly based upon the one or more phase estimate parameters.

4. The PLL of claim 1, wherein the NCO extrapolates the phase reference non-linearly based upon the one or more phase estimate parameters.

5. The PLL of claim 1, wherein the NCO includes a look-up table for determining the phase reference as a sine and cosine function.

6. The PLL of claim 1, wherein the loop filter comprises an active proportional and integral (PI) filter.

7. The PLL of claim 1, wherein the one or more phase estimate parameters include a first value proportional to a phase change and a second value proportional to a phase rate.

8. The PLL of claim 7, wherein the phase rate comprises approximately a frequency error between the incoming signal and the phase reference of the NCO.

9. The PLL of claim 7, further comprising a multiplexer for loading the first value to a phase accumulator of the NCO at the symbol rate.

10. The PLL of claim 9, wherein the phase accumulator is updated by the multiplexer with the second value divided by a number of chips per symbol.

11. The PLL of claim 1, wherein the demodulator comprises an integrate and dump mechanism for providing the phase error update.

12. The PLL of claim 11, wherein the integrate and dump mechanism comprises a Barker matched filter (BMF) or a complementary code keying (CCK) correlator bank.

13. The PLL of claim 1, wherein the phase discriminator is programmable to produce the phase error update based upon the modulation type.

14. The PLL of claim 1, wherein the modulation type is a biphase shift key (BPSK) modulation or a quadrature shift key (QPSK) modulation.

15. The PLL of claim 1, wherein the phase discriminator includes a slicing operation based upon the modulation type that produces the phase error output.

16. The PLL of claim 1, further comprising a frequency estimator for estimating a frequency error and setting a loop filter accumulator state to the frequency error.

17. The PLL of claim 16, wherein the frequency estimator comprises an accumulator that computes a decision directed cross-product discriminator to estimate the frequency error.

18. The PLL of claim 1, wherein the loop filter includes loop programmable bandwidth settings for a plurality of loop bandwidths.

19. The PLL of claim 18, wherein the loop bandwidth settings are alternately programmed to at least an acquisition and a tracking loop bandwidth.

20. A method, comprising the steps of:
receiving a phase error signal from a comparator at a chip rate;
providing a phase error update over a symbol period from the phase error signal wherein the chip rate is higher than a symbol rate;
producing a phase error output at the symbol rate from the phase error update based upon a signal modulation type;
producing one or more phase estimate parameters at a symbol rate from the phase error output; and
extrapolating a phase reference to the comparator at a chip rate from the one or more phase estimate parameters at a symbol rate;
wherein the comparator produces the phase error signal based upon the phase reference and an incoming signal.

21. The method of claim 20, wherein providing the phase error update includes removing a square wave subcarrier from the incoming signal and producing the phase error update.

22. The method of claim 20, wherein the phase reference is extrapolated linearly based upon the one or more phase estimate parameters.

23. The method of claim 20, wherein the phase reference is extrapolated non-linearly based upon the one or more phase estimate parameters.

24. The method of claim 20, wherein extrapolating the phase reference includes using a look-up table for determining the phase reference as a sine and cosine function.

25. The method of claim 20, wherein producing the one or more phase estimate parameter is performed by an active proportional and integral (PI) filter.

26. The method of claim 20, wherein the one or more phase estimate parameters include a first value proportional to a phase change and a second value proportional to a phase rate.

27. The method of claim 26, wherein the phase rate comprises approximately a frequency error between the incoming signal and the phase reference.

28. The method of claim 26, wherein a multiplexer loads the first value to a phase accumulator at the symbol rate.

29. The method of claim 28, wherein the phase accumulator is updated by the multiplexer with the second value divided by a number of chips per symbol.

30. The method of claim 20, wherein providing the phase error update is performed by an integrate and dump mechanism.

31. The method of claim 30, wherein the integrate and dump mechanism comprises a Barker matched filter (BMF) or a complementary code keying (CCK) correlator bank.

32. The method of claim 20, wherein producing the phase error output is programmable and based upon the modulation type.

33. The method of claim 20, wherein the modulation type is a biphase shift key (BPSK) modulation or a quadrature shift key (QPSK) modulation.

34. The method of claim 20, wherein producing the phase error output includes a slicing operation based upon the modulation type that produces the phase error output.

35. The method of claim 20, further comprising estimating a frequency error and setting a loop filter accumulator state to the frequency error.

36. The method of claim 35, wherein estimating the frequency error is performed with an accumulator that computes a decision directed cross-product discriminator.

37. The method of claim 20, wherein producing the one or more phase estimate parameters includes using loop programmable bandwidth settings for a plurality of loop bandwidths.

38. The method of claim 37, wherein the loop bandwidth settings are alternately programmed to at least an acquisition and a tracking loop bandwidth.

39. A phase lock loop (PLL), comprising:
means for receiving a phase error signal from a comparator at a chip rate and providing a phase error update over a symbol period wherein the chip rate is higher than a symbol rate;
means for producing an output at the symbol rate from the phase error update based upon a signal modulation type;
means for producing one or more phase estimate parameters at a symbol rate from the phase error update; and
means for extrapolating a phase reference to the comparator at a chip rate from the one or more phase estimate parameters at a symbol rate;
wherein the comparator produces the phase error signal based upon the phase reference and an incoming signal.

40. The PLL of claim 39, wherein the phase reference is extrapolated linearly based upon the one or more phase estimate parameters.

41. The PLL of claim 39, wherein the phase reference is extrapolated non-linearly based upon the one or more phase estimate parameters.

42. The PLL of claim 39, wherein the one or more phase estimate parameters include a first value proportional to a phase change and a second value proportional to a phase rate.

43. The PLL of claim 42, further comprising means for loading the first value to the extrapolating means at the symbol rate.

44. The PLL of claim 43, wherein the extrapolating means is updated by the loading means with the second value divided by a number of chips per symbol.

45. The PLL of claim 39, further comprising means for estimating a frequency error and setting a loop filter accumulator state to the frequency error.

46. The PLL of claim 39, wherein the means for producing the one or more phase estimate parameters includes loop programmable bandwidth settings for a plurality of loop bandwidths.

47. The PLL of claim 46, wherein the loop bandwidth settings are alternately programmed to at least an acquisition and a tracking loop bandwidth.

* * * * *